United States Patent [19]

Grimm et al.

[11] Patent Number: 5,508,650
[45] Date of Patent: Apr. 16, 1996

[54] DUAL FEATURE INPUT/TIMING PIN

[75] Inventors: Michael A. Grimm, Boulder Creek; Bruce D. Moore, Santa Clara, both of Calif.

[73] Assignee: Maxim Integrated Products, Inc., Sunnyvale, Calif.

[21] Appl. No.: 415,053

[22] Filed: Mar. 30, 1995

[51] Int. Cl.⁶ .................................................. H03K 17/62
[52] U.S. Cl. .......................... 327/365; 327/403; 327/404; 327/415; 327/416; 327/565
[58] Field of Search ............................ 327/365, 403–404, 327/415–416, 565

[56] References Cited

U.S. PATENT DOCUMENTS 4,588,092  5/1986  Moechnig et al. ................... 209/573
5,321,322  6/1994  Verheyen et al. ................... 327/403
5,327,018  7/1994  Karlish et al. ..................... 327/415

Primary Examiner—Margaret Rose Wambach
Attorney, Agent, or Firm—Hickman & Beyer

[57] ABSTRACT

An apparatus for enabling an IC pin to function in a dual mode, which apparatus includes a first switch for coupling the IC pin to an input terminal when the IC pin operates in an input mode, and a charging circuit for sourcing current to the IC pin during a charging cycle of a timer mode. The inventive apparatus further includes a discharging circuit for sinking current from the IC pin during a discharging cycle of the timer mode. In one embodiment, the inventive apparatus further includes a comparator for generating an activation signal, the activation signal being activated when a potential at the IC pin equals or exceeds a predefined voltage in the timer mode. In another embodiment, the comparator is disabled during the input mode.

20 Claims, 6 Drawing Sheets

FIG. 1

| SEQ | CIRCUIT ACTIVITY | MODE | RUN/ONX | TIME/ONY |
|---|---|---|---|---|
| GND | TIMER: Y-X | 1 | Y | TIMING DELAY FOR ACTIVATING SUBCIRCUIT X |
| REF | INPUT | 0 | X | Y |
| $V_{DD}$ | TIMER: X-Y | 1 | X | TIMING DELAY FOR ACTIVATING SUBCIRCUIT Y |

FIG. 2

| MODE | CIRCUIT ACTIVITY | ENABLE2 | ENABLE1 | UPB | DOWN |
|---|---|---|---|---|---|
| 1 | (TIMER: Y-X) CHARGING | 1 | 0 | 0 | 0 |
|   | DISCHARGING | 1 | 0 | 1 | 1 |
| 0 | INPUT | 0 | 1 | 1 | 0 |
| 1 | (TIMER: X-Y) CHARGING | 1 | 0 | 0 | 0 |
|   | DISCHARGING | 1 | 0 | 1 | 1 |

DUAL FEATURE INPUT/TIMING PIN

BACKGROUND OF THE INVENTION

The present invention relates to methods and apparatuses for enabling a pin on an IC package to serve a dual function. More particularly, the present invention relates to method and apparatuses for enabling an IC pin to serve both an input and a timer function without the addition of a control pin by taking advantage of capabilities inherent in the pins serving the timer function.

In the manufacturing of modern integrated circuits (IC), it is highly desirable to integrate multiple functions into one IC package in order to offer customers more functions in increasingly smaller packages. The ability to integrate multiple functions into one IC package gives customers access to more functions with fewer IC's. Consequently, a given circuit design task may be accomplished with fewer IC's, thereby saving design effort and costs.

From a manufacturer's perspective, the ability to provide multiple functions in an IC offers significant competitive advantages. By offering more functions within a chip, a manufacturer may be able to differentiate their products in the competitive market place. The ability to provide multiple functions also offers significant cost saving advantages. Even if a customer is unable to make use of all the offered functions in an IC chip, the fact that multiple functions are integrated into one IC permits the manufacturer to configure the same manufactured IC part to perform different functions to meet the needs of different customers. In this manner, the number of different IC chips that must be manufactured and kept in inventory may be reduced since the same manufactured IC chip can, in effect, be configured to appear as different parts to different customers.

In the prior art, increasing a chip's functionality typically requires additional pins, e.g. input, output, and control pins. However, as pins are added to an IC chip to offer additional functions, the size of the IC chip grows correspondingly. Since it is also desirable to keep the physical size of the IC packages as small as possible, chip designers are confronted with a dilemma. On the one hand, as IC packages become smaller and smaller, the number of pins that can be physically attached to the miniaturized package diminishes, thereby limiting the number of functions that can be offered using the prior art method. On the other hand, IC chips need to be endowed with an increasingly sophisticated set of functions to remain competitive. To provide for an ever increasing number of functions offered in each IC package, designers constantly search for ways to more efficiently utilize the limited number of pins in modern pin-limited IC packages.

By way of example, in a class of applications known as voltage regulation circuits, there is often required a timer circuit for sequencing different subcircuits of the voltage regulator IC. For example, a timer may exist in a typical voltage regulator for activating a first subcircuit, say a 5 volt power supply for some period of time before activating a second subcircuit, say a 3.3 volt power supply. The presence of a timer function such as the above-described typically requires at least 3 pins: a sequencing pin to dictate the sequence of subcircuit activation, i.e. which subcircuit should be activated first in time and which subcircuit should be activated later, a start pin to provide the signal for starting the sequence, and a timer pin for adjusting the time delay between the activation of the first subcircuit and the subsequent activation of the second subcircuit.

The use of three dedicated pins to provide a timer function in an IC circuit reduces the number of available pins that can be used for other functions. In the prior art, the pins that serve the timer function are dedicated, i.e. they can not be employed in other capacities to provide additional functionality in the IC circuit. The inability to use the pins that are dedicated to the timer function for other purposes reduces the set of functions that can otherwise be offered by the pin-limited IC circuit. If there is a way to enable an IC pin to serve both an input and a timer function, the IC can be endowed with additional functions without requiring the addition of pins and the concomitant increase in package size.

What is needed is a method and apparatus for utilizing the pins that are dedicated to the timer function to serve another function. Such improved apparatus and method would advantageously allow one or more of these dedicated pins to serve multi-functions, thereby increasing the number of functions that can be offered by modern pin-limited IC circuits.

SUMMARY OF THE INVENTION

The invention relates to an apparatus for enabling an IC pin to function in a dual mode, which apparatus includes a first switch for coupling the IC pin to an input terminal when the IC pin operates in an input mode, and a charging circuit for sourcing current to the IC pin during a charging cycle of a timer mode. The inventive apparatus further includes a discharging circuit for sinking current from the IC pin during a discharging cycle of the timer mode.

In one embodiment, the inventive apparatus further includes a comparator for generating an activation signal, the activation signal being activated when a potential at the IC pin equals or exceeds a predefined voltage in the timer mode. In another embodiment, the comparator is disabled during the input mode.

The invention also relates, in yet another embodiment, to a method for enabling an IC pin to function in a dual mode. The inventive method includes the steps of providing a first switch, the first switch coupling the IC pin to an input terminal when the IC pin operates in an input mode, and providing a charging circuit for sourcing current to the IC pin in a charging cycle of a timer mode. The inventive method further includes the step of providing a discharging circuit for sinking current from the IC pin in a discharging cycle of the timer mode.

In yet another embodiment, the inventive method further includes the steps of providing a first control circuit, the first control circuit generating a first control signal responsive to a first logic input for controlling the first switch, and providing a second control circuit, the second control circuit generating a second control signal responsive to a change from a first logic state to a second logic state of a second logic input for controlling the charging circuit. Further, the inventive method includes the step of providing a third control circuit, the third control circuit generating a third control signal responsive to a change from the second logic state to the first logic state of the second logic input for controlling the discharging circuit.

In yet another embodiment, the invention relates to a method for using an IC pin as a dual mode pin. The inventive method includes the steps of coupling the IC pin to an input pad during an input mode, and coupling the IC pin to a charging circuit during a charging cycle of a timer mode. Furthermore, the inventive method includes the steps of decoupling the IC pin from the charging circuit during a discharging cycle of the timer mode, and coupling the IC pin to a discharging circuit during the discharging cycle of the timer mode.

In yet another embodiment, the inventive method described above further includes the step of providing a control circuit for generating a first control signal, a second control signal, and a third control signal from a logic input, the first control signal controls the coupling of the IC pin to the input pad during the input mode, the second control signal controls the coupling of the IC pin to the charging circuit during the charging cycle of the timer mode, the third control signal controls the coupling of the IC pin to the discharging circuit during the discharging cycle of the timer mode, wherein the first logic input has three logic states.

DETAILED DESCRIPTION OF THE INVENTION

Figure 1:
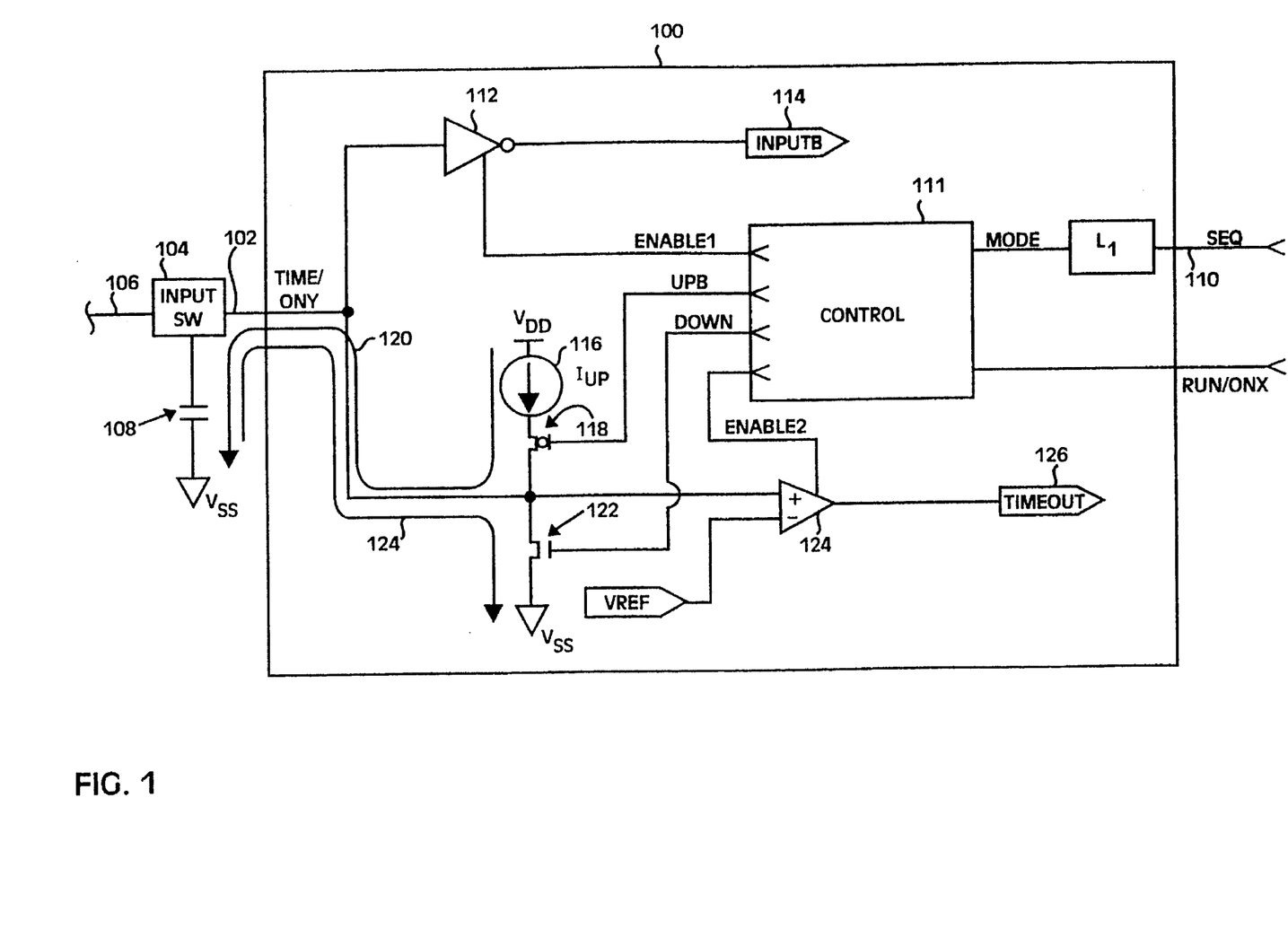
FIG. 1 shows in simplified circuit diagram format the relevant circuit portion of IC 100 for enabling pin 102 to function either as an input pin or as a timer pin.

FIG. 1 shows in simplified circuit diagram format the relevant circuit portion of IC 100 for enabling pin 102 to function either as an input pin or as a timer pin. The circuit of FIG. 1 is used to activate to subcircuits, X and Y, which are themselves not germane to the present invention and are omitted in FIG. 1 for clarity of illustration. Referring now to FIG. 1, there is shown as input switch 104, which is coupled to a conductor 106, a capacitor 108, and the aforementioned pin 102. Input switch 104 serves to couple conductor 106 to pin 102 when the circuit of FIG. 1 operates in the input mode and capacitor 108 to pin 102 when the circuit of FIG. 1 operates in the timer mode.

In one embodiment, input switch 104 may simply represent the physical connection made by the user when configuring the circuit of FIG. 1 to work either as a timer circuit or as an input circuit. In this manner, the same manufactured part embodying the circuit of FIG. 1 may be offered, and the user, depending on need, has the option of configuring the circuit of FIG. 1 to operate either as a timer or an input circuit. This embodiment advantageously reduces the number of parts that must be manufactured and inventoried by the manufacturer as well as the number of different parts that must be ordered and kept in inventory by the user.

In an alternative embodiment, input switch 104 may preferably, but not necessarily, be controlled by a signal SEQ which is also shown on a conductor 110. When so controlled, the circuit of FIG. 1 may operate as a true dual mode circuit (timer/input), i.e. not locked into one or the other, responsive to a control signal.

At any rate, pin 102 associated with signal TIME/ONY receives as its input either the signal on conductor 106 in the input mode or the charge from capacitor 108 in the timer mode. There is also shown in FIG. 1 a control circuit 111 for generating control signals ENABLE1, UPB, DOWN, and ENABLE2 from a RUN/ONX signal and a MODE signal. The signal MODE is generated from the aforementioned SEQ signal via a logic circuit L1 which takes as its input signal SEQ on conductor 110 as shown in FIG. 1. In the specific implementation shown in FIG. 2, signal SEQ has three states for indicating whether IC 100 operates in the input mode or the time mode. If IC 100 operates in the timer mode, signal SEQ further indicates the order of subcircuit activation. The generation of a binary MODE signal having two states from signal SEQ having three states represents a simple circuit exercise and is most assuredly within the skills of one of ordinary skill in the art to which this disclosure pertains.

It should be noted, however, that it is not necessary for signal SEQ to have three or more states to facilitate pin saving. By way of example, a circuit may have four pins Time1, Time2, On1, and On2, representing two timer pins and two input pins respectively. By using a two-logic-state signal SEQ, it is possible to reduce the number of pins to two: a pin for Time1/On1 and another for Time2/On2. In this example, a high state on signal SEQ, for example, may enable both of these pins to function in the timer mode. The low state on signal SEQ, for example, may enable both of these pins to function in the input mode.

When the circuit of FIG. 1 operates in the input mode conductor 106 is coupled via input switch 104 and an optional switch 112 to input terminal 114. As mentioned earlier, switch 104 may simply represent, in one embodiment, the physical connection that couples pin 102 to conductor 106. That physical connection may be a suitable plug or solder connection depending on need. As discussed in connection with FIG. 6, switch 104 may represent a true switch which operates in response to a control signal to enable the circuit of FIG. 1 to operate as a dual mode circuit.

In the embodiment of FIG. 1, switch 112 represents an inverter having an optional control circuit that is enabled by signal ENABLE1. In the input mode, control signal ENABLE1 is activated, allowing the input signal on conductor 106 to traverse inverter switch 112 to appear at terminal 114 in its inverted form, INPUTB. Signal INPUTB on terminal 114 is used to turn on the Y subcircuit in the input mode. On the other hand, signal RUN/ONX, also shown in FIG. 1, is used to turn on the X subcircuit in the input mode.

In the timer mode, control signal ENABLE1 is disabled. Further, conductor 106 is decoupled from pin 102. Instead, capacitor 108 is coupled to pin 102 to be charged up during the charging cycle by a current source 116 via an optional p-channel device 118. Current source 116 may be a linear current source, e.g. an active current source, or a nonlinear current source, e.g. via a resistor, or the like. During this charging cycle of the timer mode, p-channel device 118 is turned on by a control signal UPB to enable current to flow in the direction of current path 120. As is apparent, current source 116 and p-channel device 118 function as a charging circuit during the charging cycle in the timer mode for sourcing current to pin 102 and capacitor 108. Furthermore, an n-channel device 122 is preferably turned off during this charging cycle of the timer mode by a control signal DOWN to prevent the existence of a possible crowbar condition.

During the discharging cycle of the timer mode, p-channel device 118 is preferably turned off by control signal UPB. In one embodiment, the discharging cycle is initiated when signal RUN/ONX is deactivated. N-channel device 122 is turned on by control signal DOWN to permit current to flow out of capacitor 108 in the direction shown by current path 124. In this manner, n-channel device 122 functions as a discharging circuit for sinking current from IC pin 102 and capacitor 108 during the discharging cycle of the timer mode.

During the aforementioned timer mode, a signal ENABLE2 from control circuit 111 is activated to turn on a comparator 124. Control circuit 11 represents one or more control circuits for generating control signals ENABLE1, UPB, DOWN, and ENABLE2 from input signals MODE and RUN/ONX. Comparator 124 takes as its inputs a reference voltage VREF on its (−) input and the signal coming from pin 102 (which is coupled to capacitor 108 during the timer mode) as its (+) input. Comparator 124 compares the voltage on pin 108 with reference voltage VREF and outputs a TIMEOUT signal on terminal 126, representing an activation signal for activating a subsequent subcircuit. In the timer mode, signal RUN/ONX is used to turn on the X subcircuit and to begin charging capacitor 108 while signal TIMEOUT on terminal 126 is used to subsequently turn on the Y subcircuit when the voltage on pin 102 rises above reference voltage VREF.

Figure 2:
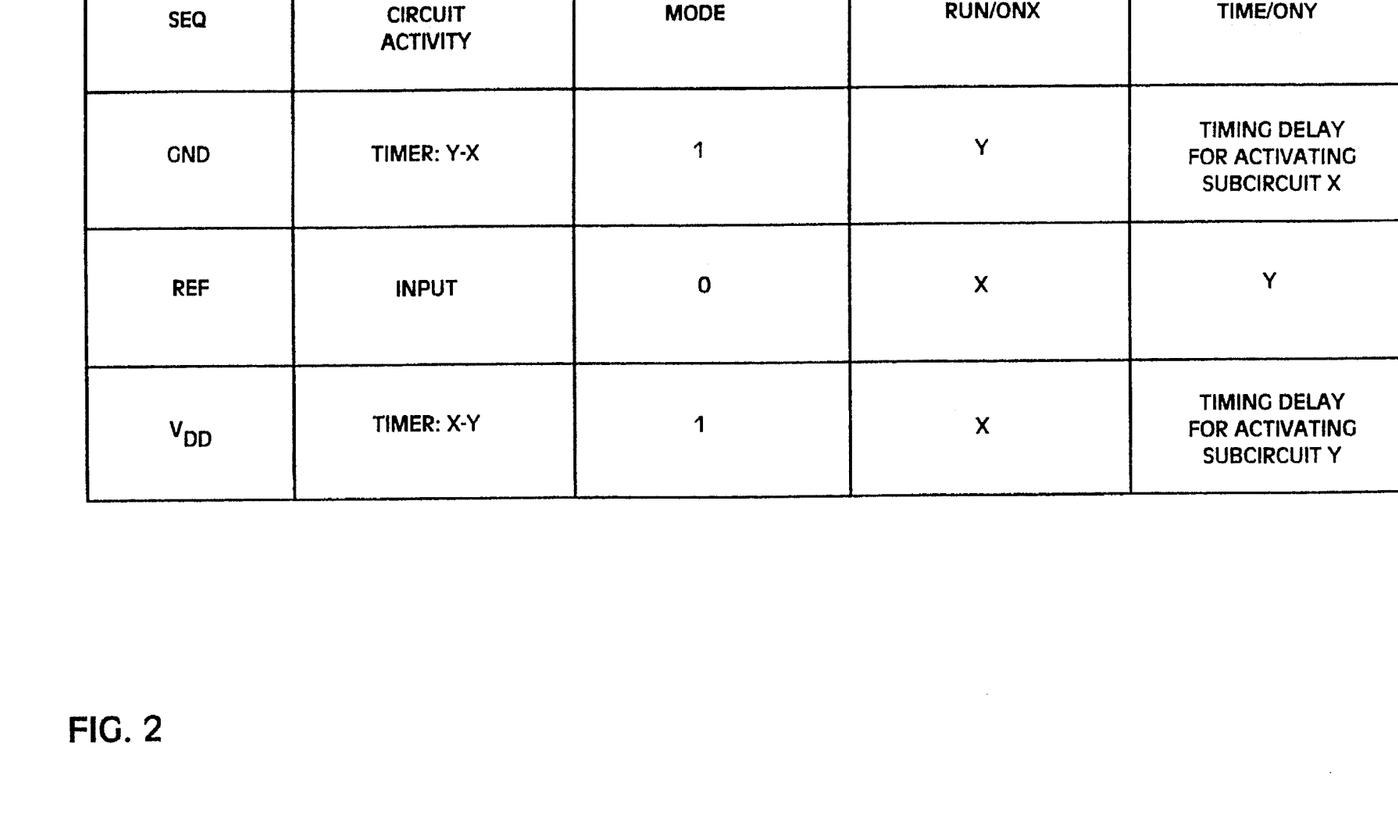
FIG. 2 shows in a simplified table format the states of signals SEQ, the circuit activities and modes that are indicated by the SEQ states, and the functions of pin RUN/ONX and TIME/ONY during the SEQ states.

FIG. 2 shows in a simplified table format the logic states of signals SEQ, the circuit activities and modes that are indicated by the SEQ states, and the functions of pin RUN/ONX and TIME/ONY during the SEQ states. As mentioned earlier, signal SEQ is supplied to the circuit of FIG. 1 via pin 110. To enable pin TIME/ONY to function either as an input pin or a timer pin, signal SEQ preferably has three states: ground (GND), reference (REF), and VDD. To distinguish between these states, a circuit (not shown and known in the art) having two comparators is preferably used to distinguish between these three states. In one embodiment, signal SEQ is hardwired to the appropriate state to set the operating mode of the circuit and pin TIME/ONY. Alternatively, signal SEQ may be generated by an appropriate circuit to permit the circuit of FIG. 1 to function as a true dual mode circuit when implemented.

Signal SEQ controls the switch over between the timing mode and the input mode. Binary signal MODE is generated from the three-level SEQ signal and indicates whether the circuit is in its input mode (0) or its timer mode (1). When signal SEQ is in either the GND or VDD state, the timing mode is indicated and signal MODE assumes a 1 state. On the other hand, when signal SEQ is in its REF state, the circuit is in its input mode and signal MODE assumes a 0 state. In this case, signal RUN/ONX is used to activate subcircuit X, and signal TIME/ONY via pin 102 and terminal 114 is used to turn on subcircuit Y independent of the activation of subcircuit X. In this manner, the pin that is associated with signal TIME/ONY, i.e. pin 102 in the circuit of FIG. 1, is used in the input mode as a true digital input via terminal 114.

In the timing mode, signal SEQ further specifies whether subcircuit X or subcircuit Y should be the first to be activated. In this manner, signal SEQ not only specifies whether the circuit of FIG. 1 operates in either the input mode or the timer mode but also which subcircuit should be activated first in the timer mode.

In the embodiment of FIG. 2, it is arbitrarily assigned, for illustration purposes, that subcircuit Y will be activated before subcircuit X when signal SEQ is in its GND state. In this case the capacitor associated with pin 102, which is also associated with TIME/ONY pin, controls the delay for activating subcircuit X. Conversely, subcircuit X is activated before subcircuit Y when signal SEQ is in its VDD state, and pin 102, which is associated with TIME/ONY, is used to time the delay for activating subcircuit Y. The delay between the activations of the subcircuits is determined partly by the circuit designer in the specification of current source 116, p-channel device 118, reference voltage VREF, and partly by the user in his or her choice for the size of capacitor 108.

In this manner, pin 102 which is associated with TIME/ONY is transformed from a dedicated timer pin to a dual (input/timer) pin via the addition of another logic level on signal SEQ. As is apparent, no additional pins are required on the IC to enable pin 102 to operate in its dual mode. It should be apparent, however, that if there are pins to spare on the IC, it is possible to use an additional pin to specify the state representing either the timer mode or the input mode for pin 102. Although this requires an additional pin to enable pin 102 to function in its dual capacity, as either an input pin or a timer pin, such arrangement may be advantageous due to layout or other considerations that make it desirable to provide pin 102 with a dual mode capability.

Figure 3:
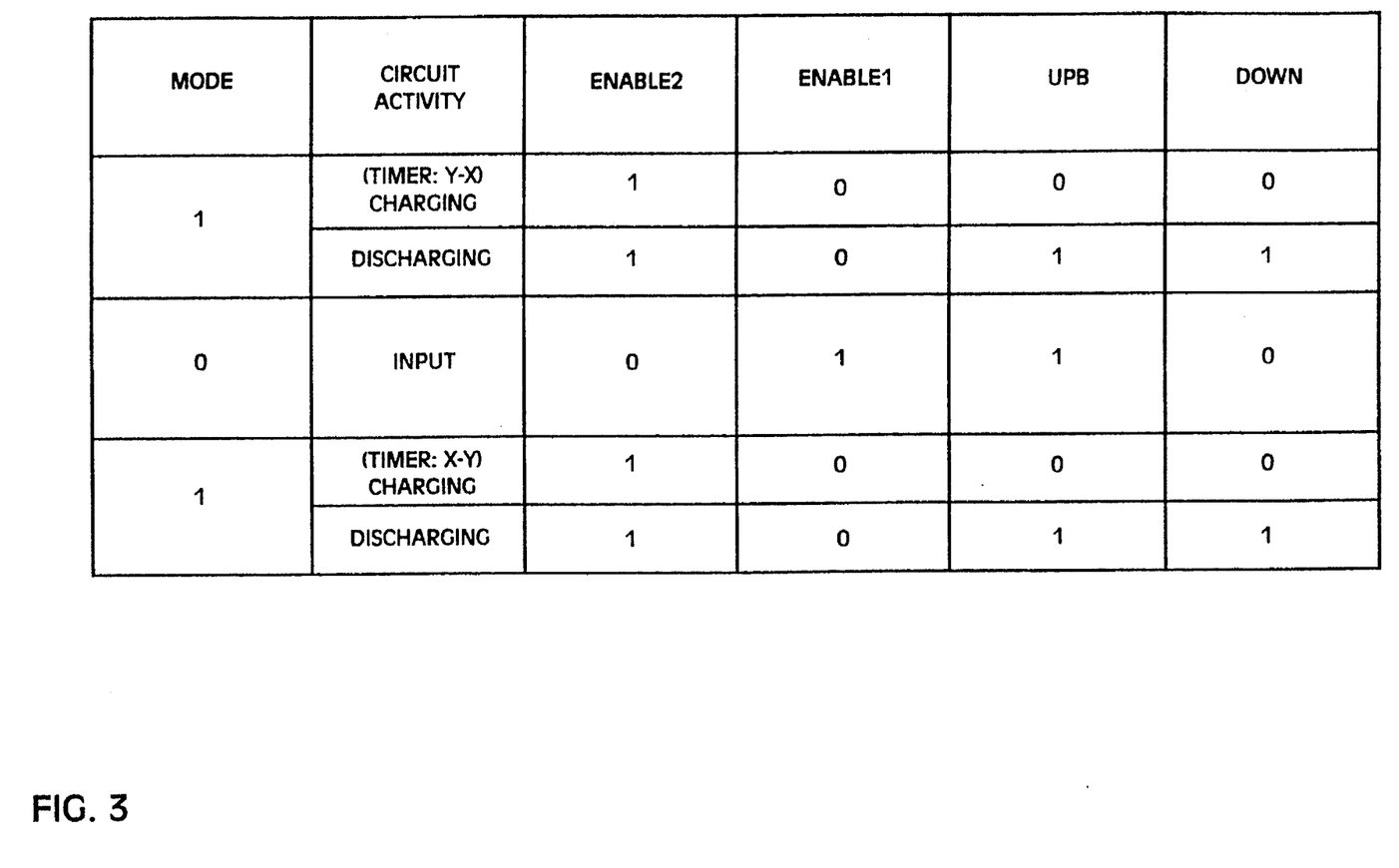
FIG. 3 shows in a simplified table format the states of signal MODE and the circuit activities that are controlled by the states of signal SEQ.

FIG. 3 shows in a simplified table format the states of signal MODE and the circuit activities that are controlled by the states of signal SEQ, which is shown in FIG. 2. FIG. 3 further shows the response of control signals ENABLE2, ENABLE1, DOWN, and UPB in response to the circuit activities that are controlled by signal SEQ.

Referring now to FIG. 3, when the circuit activities is its TIMER:Y-X, i.e. timer mode and subcircuit Y activated prior to subcircuit X, it is preferable to activate comparator 124 and disable switch 112 to decouple pin 102 from terminal 114. The activation of comparator 124 is accomplished by the high ENABLE2 signal and the disabling of switch 112 is accomplished via the low control signal ENABLE1. Note that it is preferable to keep control signal ENABLE2 high and control signal ENABLE1 low regardless whether capacitor 108 is in its charging or discharging state.

When the circuit is in its timer mode and capacitor 108 is charging, p-channel device 118 is turned on via the low UPB signal and n-channel device 122 is preferably turned off via the low control signal DOWN to prevent a crowbar condition. P-channel device 118 is preferably sized appropriately to offer a reasonable ramp up rate across capacitor 108 during the charging cycle when the circuit of FIG. 1 operates in the timer mode. On the other hand, p-channel device 118 is preferably off via the high control signal UPB and n-channel device 122 is on via the high control signal DOWN during the discharging cycle of capacitor 108. As discussed earlier, the discharge cycle preferably starts when signal RUN/ONX is deactivated. In one embodiment, n-channel device 122 is preferably chosen to be greater in strength than current source 116 in order to facilitate a rapid discharge of capacitor 108.

In a similar manner, control signal ENABLE2 is high during the TIMER:X/Y mode, i.e. timer mode and subcircuit X activated prior to subcircuit Y, to turn on comparator 124. Control signal ENABLE1 stays off to disable switch 112 during this TIMER:X/Y mode. During charging, p-channel device 118 is turned on by the low control signal UPB and n-channel device 122 is preferably turned off by the low control signal DOWN to prevent a crowbar condition. During the discharging cycle of capacitor 108, n-channel device 122 is turned on by the high control signal DOWN to allow current to flow in the direction of path 124 and p-channel device 128 is preferably turned off by the high control signal UPB. The states of these control signals during the aforementioned circuit modes are shown in FIG. 3.

When the circuit is in its input mode, it is preferable to disable comparator 124 via the low control signal ENABLE2 and to activate switch 112 via the high control signal ENABLE1. The state of these control signals, ENABLE2 and ENABLE1, during the input mode are shown in FIG. 3. Furthermore, it is preferable to turn off p-channel device 118 and n-channel device 122 in order to have a high impedance at the digital input during the input mode. P-channel device 118 is disabled via the high control signal UPB and n-channel device 122 is disabled via the low control signal DOWN as shown in FIG. 3.

It should be noted, however, that the disabling of comparator 124 during the input mode is optional and may be omitted, albeit possibly at the expense of increased power consumption, in some embodiment without departing from the scope and spirit of the invention. Furthermore, the disabling of either p-channel device 118 or n-channel device 122 during the input mode is also optional and may be omitted, albeit also possibly at the expense of increased power consumption during the input mode, in some embodiment. The circuit of FIG. 1 shows one implementation of switch 112 having the disable feature in order to eliminate possible crowbar currents through the inverter in switch 112 during the timer mode when pin 102 is used as an analog timer. The disabling of switch 112 via a low control signal ENABLE1 is also optional and may be omitted in some embodiment without departing from the scope and spirit of the invention, (albeit possibly at the expense of increased power consumption).

Figure 4:
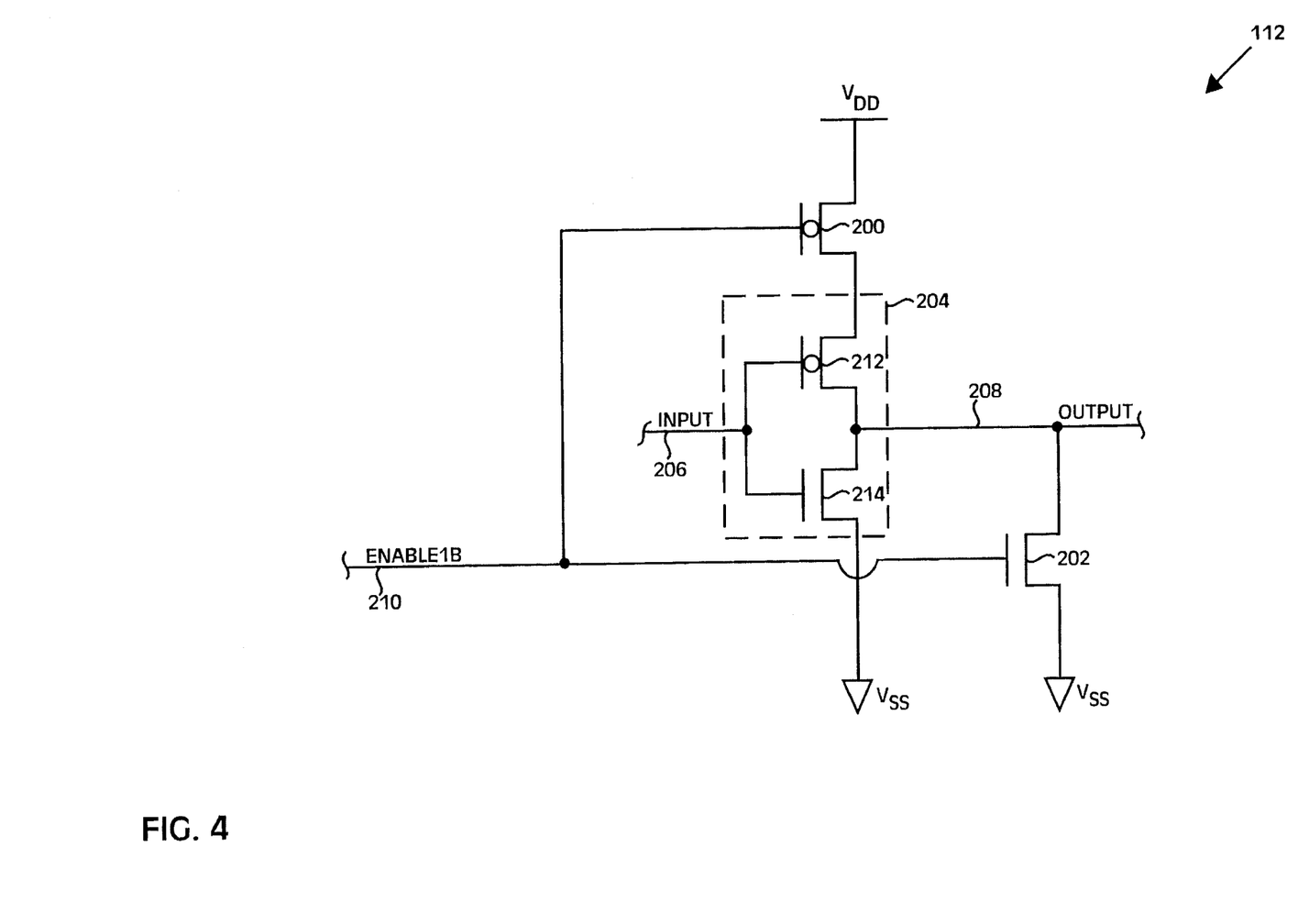
FIG. 4 shows in a simplified circuit diagram format switch 112 of FIG. 1, including the optional enabling circuit comprising p-channel device 200 and n-channel device 202.

FIG. 4 shows in a simplified circuit diagram format switch 112 of FIG. 1, including the optional enabling circuit comprising p-channel device 200 and n-channel device 202. FIG. 4 also shows a buffer inverter circuit 204 which takes as its input an INPUT signal on a conductor 206. In the circuit of FIG. 1, conductor 206 of switch 112 is coupled to pin 102 to buffer the signal coming in on conductor 106 and to output a buffer signal on a conductor 208.

When the circuit of FIG. 1 is in its input mode, control signal ENABLE1 goes high and control signal ENABLE1B goes low. It should be noted that although the circuit of FIG. 1 shows control signal ENABLE1 going high to enable switch 112, it is possible to generate control signal ENABLE1B directly from control circuit 111. When control signal ENABLE1B goes low in the input mode, p-channel device 200 turns on and n-channel device 202 turns off. The signal from conductor 206 is then buffered by the inverter circuit comprising serially connected p-channel devices 200 and 212 as well as n-channel device 214. On the other hand, when the circuit is in its timer mode, control signal ENABLE1B goes high to turn off p-channel device 200 and disconnect the rest of switch 112 from VDD and to turn on n-channel device 202 to clamp the output on conductor 208 to VSS, thereby inhibiting a possible crowbar condition through switch 112.

As mentioned previously, the optional enabling circuit associated with switch 112 prevents power from being consumed via switch 112, and more specifically via buffer/inverter circuit 204, when the inventive circuit is in its timer mode. In one embodiment, the p-channel devices (200 and 212) and n-channel device 214, which devices form the buffer/inverter circuit for buffering the input on conductor 206 during the input mode, may be skewed to derive the appropriate input threshold. For example, to make the input on conductor 206 TTL compatible, p-channel devices 200 and 212 may be made weaker in strength compared to n-channel device 214 so that n-channel device 214 may be switched with a lower gate drive. It should be noted, however, that although a buffer/inverter circuit is used to buffer the input signal on conductor 206, other types of inverter logic including tri-state logic, or NAND, NOR, or the like may be used without departing from the scope and spirit of the present invention.

Figure 5:
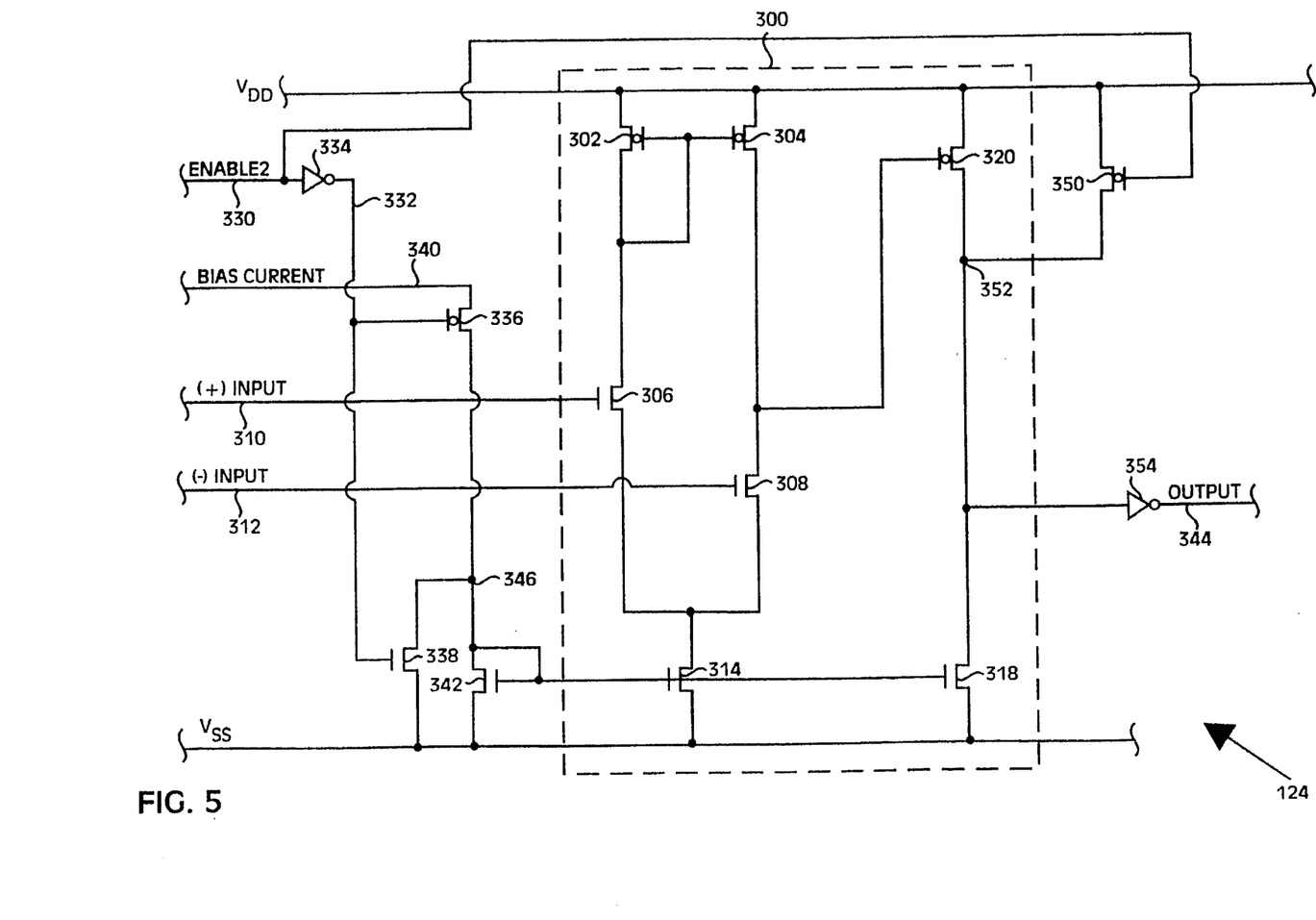
FIG. 5 shows in a simplified circuit diagram an implementation of comparator 124 of FIG. 1, including the optional enabling circuit for disabling comparator 124 when the circuit of FIG. 1 is in the input mode.

FIG. 5 shows in a simplified circuit diagram an implementation of comparator 124 of FIG. 1, including the optional enabling circuit for disabling comparator 124 when the circuit of FIG. 1 is in the input mode. Referring now to FIG. 5, there is shown a 7-transistor comparator op-amp 300. Comparator op-amp 300 includes a current mirror pair 302 and 304 and an input differential pair 306 and 308, which are controlled respectively by (+) input on a conductor 310 and a (−) input on a conductor 312. The input signals on conductor 310 and 312 are coupled to pin 102 and reference voltage VREF respectively when the circuit of FIG. 1 is in its timer mode. Comparator op-amp 300 further includes current sources 314 and 318 as well as p-channel device 320.

In operation, when the inventive circuit is in its timer mode and control signal ENABLE2 goes high on a conductor 330, conductor 332 goes low due to the action of an inverter 334. The low state of conductor 332 turns on a p-channel device 336 and turn off a n-channel device 338. When this happens, bias current on conductor 340 flows through p-channel device 336 and diode connected n-channel device 342 to bias up devices 342, 314, and 318. In this timer mode, comparator op-amp 300 operates as expected to compare the inputs on conductors 310 and 312 and outputs a signal on a conductor 344 when the voltage on conductor 310 rises above the reference voltage on conductor 312.

When the inventive circuit enters the input mode, control signal ENABLE2 on conductor 330 goes low, causing conductor 332 to go high, thereby turning off p-channel device 336 and turning on n-channel device 338. Consequently, a node 346 of FIG. 5 is decoupled from the bias current on conductor 340 and pulled toward VSS by the conducting n-channel device 338. When node 346 is pulled toward VSS, n-channel devices 342, 314, and 318 are turned off, thereby decoupling comparator op-amp 300 from VSS. Further, the low state of control signal ENABLE2 on conductor 330 turns on an p-channel device 350, thereby coupling a node 352 to VDD via the conducting p-channel device 350. When this happens, the output signal on conductor 344 is forced low via an inverter 354, effectively clamping conductor 344 low to inhibit a possible crowbar condition in inverter 354.

Figure 6:
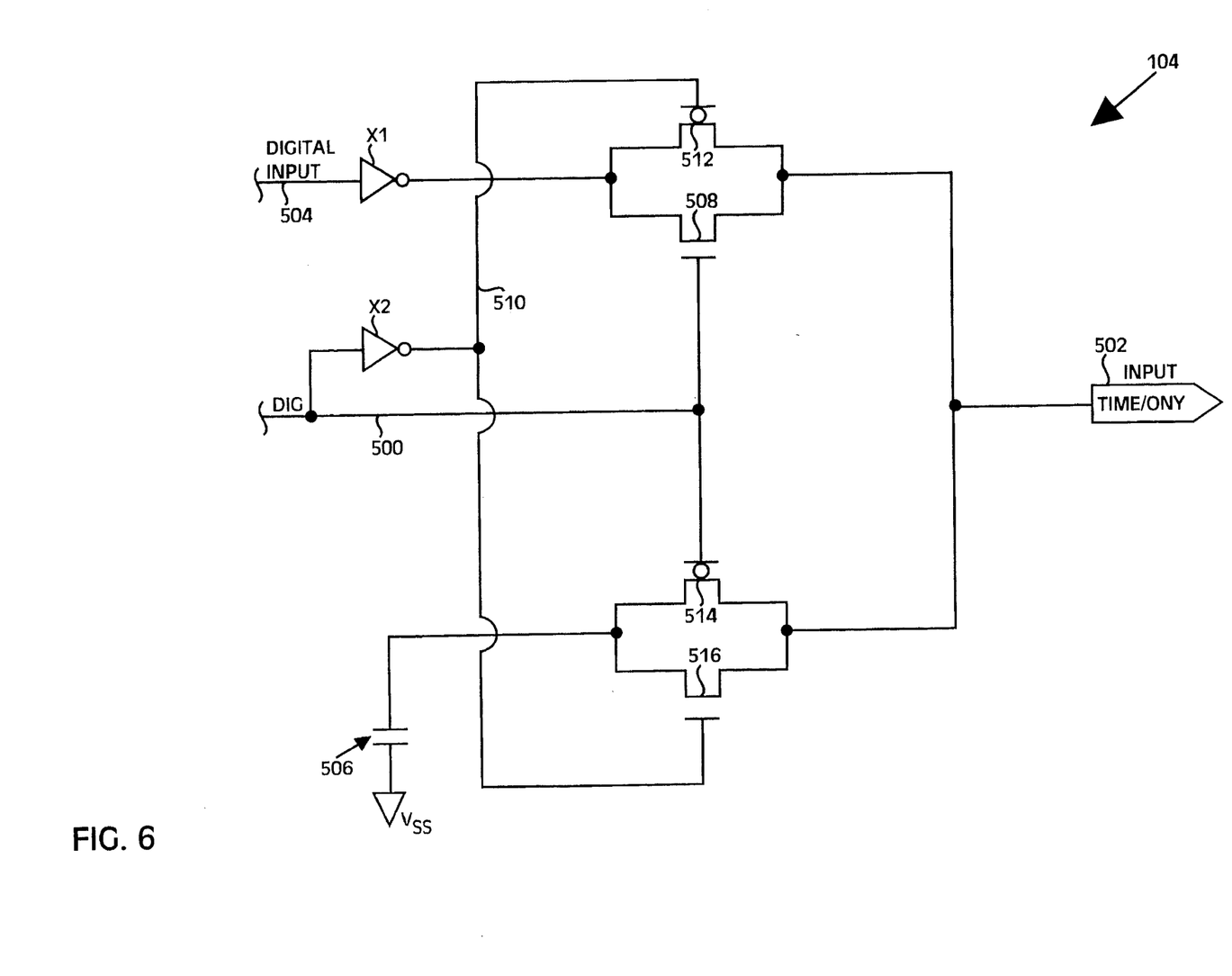
FIG. 6 shows in a simplified circuit diagram format an implementation of switch 104 of FIG. 1 using an external multiplexer to accomplish the switching function when the circuit of FIG. 1 operates as a true dual mode circuit.

FIG. 6 shows in a simplified circuit diagram format an implementation of switch 104 of FIG. 1 using an external multiplexer to accomplish the switching function when the circuit of FIG. 1 operates as a true dual mode circuit. Referring now to FIG. 6, there is shown an input DIG on a conductor 500. When input DIG is high, signifying the input mode, an input pad 502 is coupled to a digital input on a conductor 504. Conversely, when input DIG is low, signifying the timer mode, input pad 502 is coupled to a capacitor

506, representing capacitor 108 of FIG. 1. In one embodiment, input DIG represents the inverse of aforementioned signal MODE.

In operation, when input DIG goes high on conductor 500, an n-channel device 508 is turned on. The high input DIG further causes a conductor 510 to go low via an inverter X2, turning on a p-channel device 512. Consequently, input pad 502 is coupled to the digital input on conductor 504 via an inverter/buffer X1. Furthermore, the high input DIG on conductor 500 turns off a p-channel device 514. The low state of conductor 510, caused by the high input DIG via inverter X2, also turns off an n-channel device 516. As is apparent, input pad 502 is completely decoupled from capacitor 506 when input DIG is high in the input mode.

On the other hand, when input DIG goes low on conductor 500 to signify the timer mode, p-channel device 514 is turned on. The low input DIG further causes conductor 510 to go high via inverter X2, turning on a n-channel device 516. Consequently, input pad 502 is coupled to capacitor 506 via both p-channel device 514 and n-channel device 516 during the timer mode. Furthermore, the low input DIG on conductor 500 also turns off n-channel device 508. The high state of conductor 510, caused by the low input DIG via inverter X2, further turns off p-channel device 512. As is apparent, input pad 502 is completely decoupled from the digital input on conductor 504 when input DIG is high in the timer mode.

It should be noted, however, that the circuit of FIG. 6 represents only one implementation of switch 104. Given this disclosure, it should be obvious to those of skill in the art that the switching function performed by switch 104 may be implemented using other circuits known in the art. As one example, variations and substitutions may be made in the circuit of FIG. 6 without departing from the scope and spirit of the present invention. In one embodiment, p-channel devices 512 and 514 may be omitted altogether if the thresholds of n-channel devices 508 and 516 are sufficiently low. If the gate signal are driven below Vss in order to allow low signals to pass through the multiplexer circuit, it is possible, in one embodiment, to use only p-channel devices 512 and 514, i.e. without n-channel devices 508 and 516.

Although only a few embodiments of the present invention have been described in detail, it should be understood that the present invention may be embodied in many other specific forms without departing from the spirit or scope of the invention. As an example, although the circuits herein have been described with reference to active high logic for ease of discussion, circuits utilizing active low logic may be utilized without departing from the scope and spirit of the invention. Further, although the disclosed circuits employ MOS switches having p-channels and n-channels, other types of switches and transistors may be used given appropriately generated signals. Such substitutions and variations on the inventive concepts are possible and are within the skills of one skilled in the art given this disclosure. As a further example, the circuit of FIG. 1, particularly capacitor 108 and reference voltage VREF, may be referenced to VDD instead of VSS, thereby causing the voltage at pin 102 to ramp down instead of ramping up prior to a subsequent activation of the timed subcircuit. In view of the foregoing, it should be apparent that the present examples are to be considered as illustrative and not restrictive, and the invention is not to be limited to the details given herein, but may be modified within the scope of the appended claims.

We claim:

1. An apparatus for enabling an IC pin to function in a dual mode, comprising:

a first switch for coupling said IC pin to an input terminal when said IC pin operates in an input mode;

a charging circuit for sourcing current to said IC pin during a charging cycle of a timer mode; and a discharging circuit for sinking current from said IC pin during a discharging cycle of said timer mode.

2. The apparatus of claim 1 further comprising a comparator for generating an activation signal, said activation signal being activated when a potential at said IC pin equals or exceeds a predefined voltage in said timer mode.

3. The apparatus of claim 1 wherein said comparator is disabled during said input mode.

4. The apparatus of claim 1 further comprising a first control circuit for generating a first control signal from a first logic signal, wherein said first switch couples said IC pin to said input terminal responsive to said first control signal.

5. The apparatus of claim 4 further comprising a second control circuit for generating a second control signal from a second logic signal when said second logic signal changes from a first logic state to a second logic state, wherein charging circuit sources said current to said IC pin responsive to said second control signal.

6. The apparatus of claim 5 further comprising a third control circuit for generating a third control signal from said second logic signal when said second logic signal changes from said second logic state to said first logic state, wherein said discharging circuit sinks said current from said IC pin responsive to said third control signal.

7. The apparatus of claim 6 further comprising a comparator for generating an activation signal, said activation signal being activated when a potential at said IC pin equals or exceeds a predefined voltage in said timer mode.

8. The apparatus of claim 7 wherein said first logic signal is a signal having three logic states.

9. The apparatus of claim 7 wherein the delay between when said second logic signal changes from said first logic state to said second logic state and when said activation signal is generated is user-selectable based on the size of a capacitor coupled to said IC pin.

10. The apparatus of claim 9 wherein said charging circuit comprises a current source and a first transistor switch having a first transistor gate controlled by said second control signal and said discharging circuit comprises a second transistor switch coupled between said IC pin and a reference voltage, said second transistor switch further having a gate controlled by said third control signal.

11. The apparatus of claim 1 wherein said input terminal is decoupled from said IC pin during said timer mode.

12. The apparatus of claim 11 wherein said charging circuit and said discharging circuit are decoupled from said IC pin during said input mode.

13. A method for enabling an IC pin to function in a dual mode, comprising:

providing a first switch, said first switch coupling said IC pin to an input terminal when said IC pin operates in an input mode;

providing a charging circuit for sourcing current to said IC pin in a charging cycle of a timer mode; and providing a discharging circuit for sinking current from said IC pin in a discharging cycle of said timer mode.

14. The method of claim 13 further comprising:

providing a first control circuit, said first control circuit generating a first control signal responsive to a first logic input for controlling said first switch;

providing a second control circuit, said second control circuit generating a second control signal responsive to a change from a first logic state to a second logic state of a second logic input for controlling said charging circuit; and providing a third control circuit, said third control circuit generating a third control signal responsive to a change from said second logic state to said first logic state of said second logic input for controlling said discharging circuit.

15. The method of claim 14 wherein said input terminal is decoupled from said IC pin during said timer mode.

16. The method of claim 15 wherein said charging circuit and said discharging circuit are decoupled from said IC pin during said input mode.

17. The method of claim 13 further comprising:

providing a comparator for generating an activation signal, said activation signal being activated when a potential at said IC pin equals or exceeds a predefined voltage in said timer mode.

18. The method of claim 14 further comprising:

providing a fourth control circuit, said fourth control circuit generating a fourth control signal responsive to said first logic input for enabling said comparator during said timer mode and for disabling said comparator during said timer mode.

19. A method for using an IC pin as a dual mode pin, comprising:

coupling said IC pin to an input pad during an input mode;

coupling said IC pin to a charging circuit during a charging cycle of a timer mode;

decoupling said IC pin from said charging circuit during a discharging cycle of said timer mode; and coupling said IC pin to a discharging circuit during said discharging cycle of said timer mode.

20. The method of claim 19 further comprising:

providing a control circuit for generating a first control signal, a second control signal, and a third control signal from a logic input, said first control signal controls the coupling of said IC pin to said input pad during said input mode, said second control signal controls the coupling of said IC pin to said charging circuit during said charging cycle of said timer mode, said third control signal controls the coupling of said IC pin to said discharging circuit during said discharging cycle of said timer mode, wherein said first logic input has three logic states.

* * * * *